United States Patent
Huang et al.

(10) Patent No.: US 11,515,249 B2
(45) Date of Patent: Nov. 29, 2022

(54) WIRING PACKAGE AND METHOD OF MANUFACTURING THE SAME

(71) Applicant: Advanced Semiconductor Engineering, Inc., Kaohsiung (TW)

(72) Inventors: Chih-Yi Huang, Kaohsiung (TW); Chen-Chao Wang, Kaohsiung (TW); Mi-Chun Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 84 days.

(21) Appl. No.: 17/090,671

(22) Filed: Nov. 5, 2020

(65) Prior Publication Data

US 2022/0139824 A1    May 5, 2022

(51) Int. Cl.
*H01L 23/522* (2006.01)
*H01L 21/768* (2006.01)
*H01L 23/528* (2006.01)

(52) U.S. Cl.
CPC .... *H01L 23/5226* (2013.01); *H01L 21/76802* (2013.01); *H01L 21/76877* (2013.01); *H01L 23/528* (2013.01)

(58) Field of Classification Search
CPC .......... H01L 23/5226; H01L 21/76802; H01L 21/76877; H01L 23/528
See application file for complete search history.

(56) References Cited

U.S. PATENT DOCUMENTS

| | | | |
|---|---|---|---|
| 9,893,093 B2* | 2/2018 | Kim | H01L 27/124 |
| 2021/0118958 A1* | 4/2021 | Park | G06F 3/04164 |

* cited by examiner

*Primary Examiner* — Karen Kusumakar
(74) *Attorney, Agent, or Firm* — Foley & Lardner LLP

(57) ABSTRACT

At least some embodiments of the present disclosure relate to a wiring structure and a method for manufacturing a wiring structure. The wiring structure includes a conductive structure, a first fan-out structure, and a second fan-out structure. The first fan-out structure is disposed on the conductive structure and includes a first circuit layer. The second fan-out structure is disposed on the conductive structure, and includes a second circuit layer. A thickness of the first circuit layer is different from a thickness of the second circuit layer.

15 Claims, 8 Drawing Sheets

WIRING PACKAGE AND METHOD OF MANUFACTURING THE SAME

BACKGROUND

1. Technical Field

The present disclosure relates to a wiring structure comprising different fan-out structures, and a method of manufacturing the same. In particular, functions of the different fan-out structures are different.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Accordingly, a hybrid fan-out substrate technique is developing.

SUMMARY

In some embodiments, according to one aspect of the present disclosure, a wiring structure includes a conductive structure, a first fan-out structure, and a second fan-out structure. The first fan-out structure is disposed on the conductive structure and includes a first circuit layer. The second fan-out structure is disposed on the conductive structure, and includes a second circuit layer. A thickness of the first circuit layer is different from a thickness of the second circuit layer.

In some embodiments, according to one aspect of the present disclosure, a wiring structure includes a conductive structure, a first fan-out structure and a second fan-out structure. The first fan-out structure and the second fan-out structure are disposed on the conductive structure. A signal transmitted in the first fan-out structure is different from a signal transmitted in the second fan-out structure.

In some embodiments, according to another aspect of the present disclosure, a method is disclosed for manufacturing a wiring structure. The method includes: providing a conductive structure with at least one dielectric layer and a circuit layer disposed on the at least one dielectric layer; disposing a first fan-out structure on the conductive structure; disposing a second fan-out structure on the conductive structure, the second fan-out structure being adjacent to the first fan-out structure; and forming a first through via in the first fan-out structure and forming a second through via in the second fan-out structure, wherein the first through via and the second through via are in contact with the circuit layer of the conductive structure.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1:
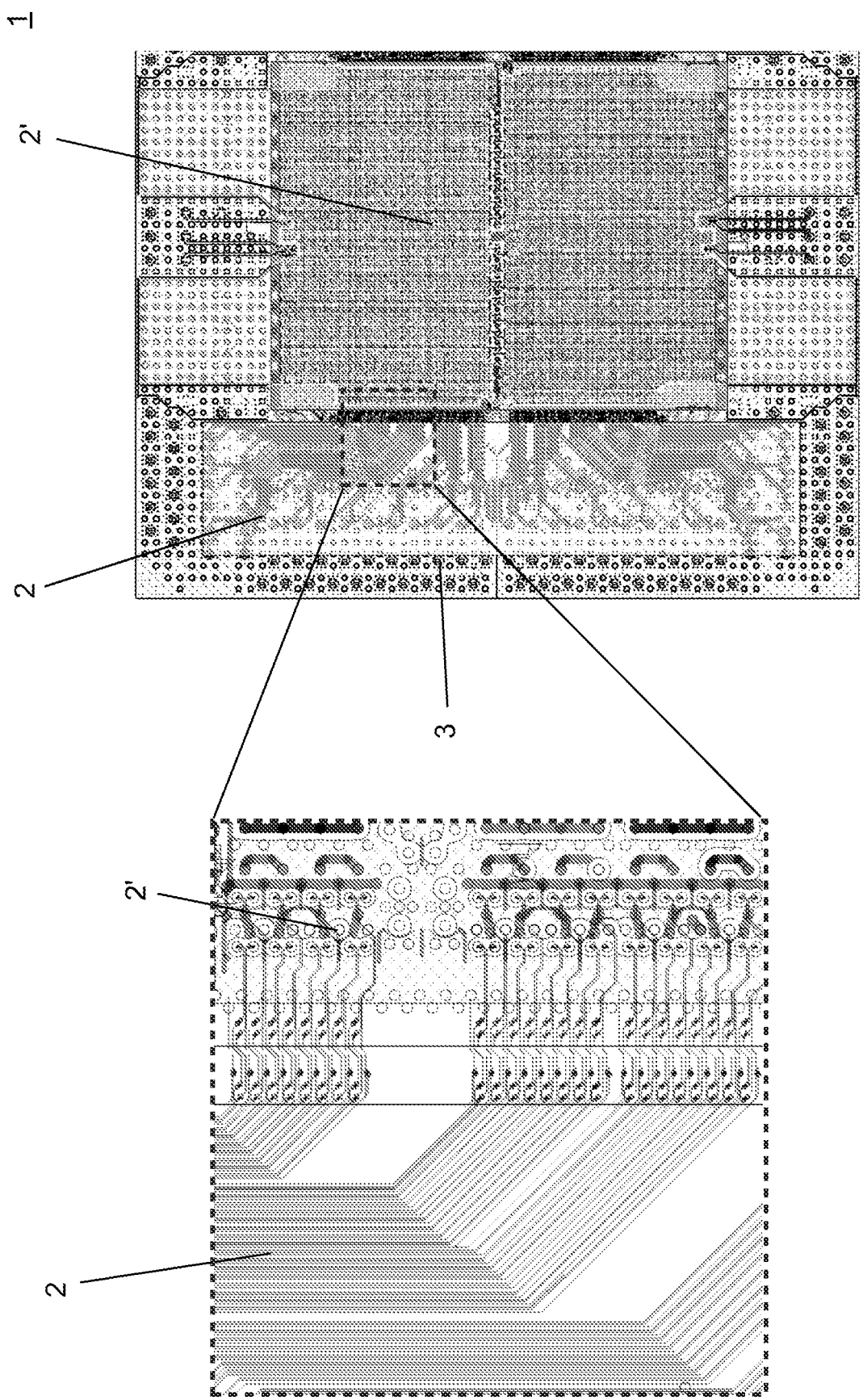
FIG. 1 illustrates a layout of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Regarding the hybrid fan-out substrate technique, a hybrid fan-out substrate secures a fan-out structure to a conductive structure through an adhesive. Generally, the conductive structure may include a large size such that SerDes (Serializer/Deserializer) circuits are arranged in the substrate and high frequency signals (e.g., SerDes signals) are transmitted in the conductive structure. In addition, a width of a SerDes circuit should be large so as to avoid large impedance. Since the width of the SerDes circuit is different from that of other conductive layers in a substrate, a yield for manufacturing the substrate would be reduced.

To address such concerns, at least some embodiments of the present disclosure provide for a wiring structure which includes two fan-out structures disosed on a conductive structure, and the circuit layers of the two fan-out structures have different thicknesses or transmit different signals. At least some embodiments of the present disclosure further provide for techniques for manufacturing the wiring structure and the assembly structure.

FIG. 1 is a layout of a wiring structure 1 in accordance with some embodiments of the present disclosure. The wiring structure 1 includes a first fan-out structure 2, a second fan-out structure 2', and a conductive structure 3.

The first fan-out structure 2 is disposed on the conductive structure 3. The second fan-out structure 2' is disposed on the conductive structure 3. The first fan-out structure 2 is proximity to the second fan-out structure 2'. The first fan-out structure 2 is electrically communicated with the second fan-out structure 2'. A line width/line space (L/S) of the first fan-out structure 2 is different from an L/S of the second fan-out structure 2'. The function of the first fan-out structure 2 is different from that of the second fan-out structure 2'.

The first fan-out structure 2 is arranged for circuit connections. The second fan-out structure 2' is arranged for circuit connections. The first fan-out structure 2 and the second fan-out structure 2' are connected to each other through the conductive structure 3. The circuits may be routed to ball grid arrays (BGA).

According to the circuit layout, the layouts of the first fan-out structure 2 and the second fan-out structure 2' are designed for SerDes signals and power/ground signals, respectively.

Figure 2:
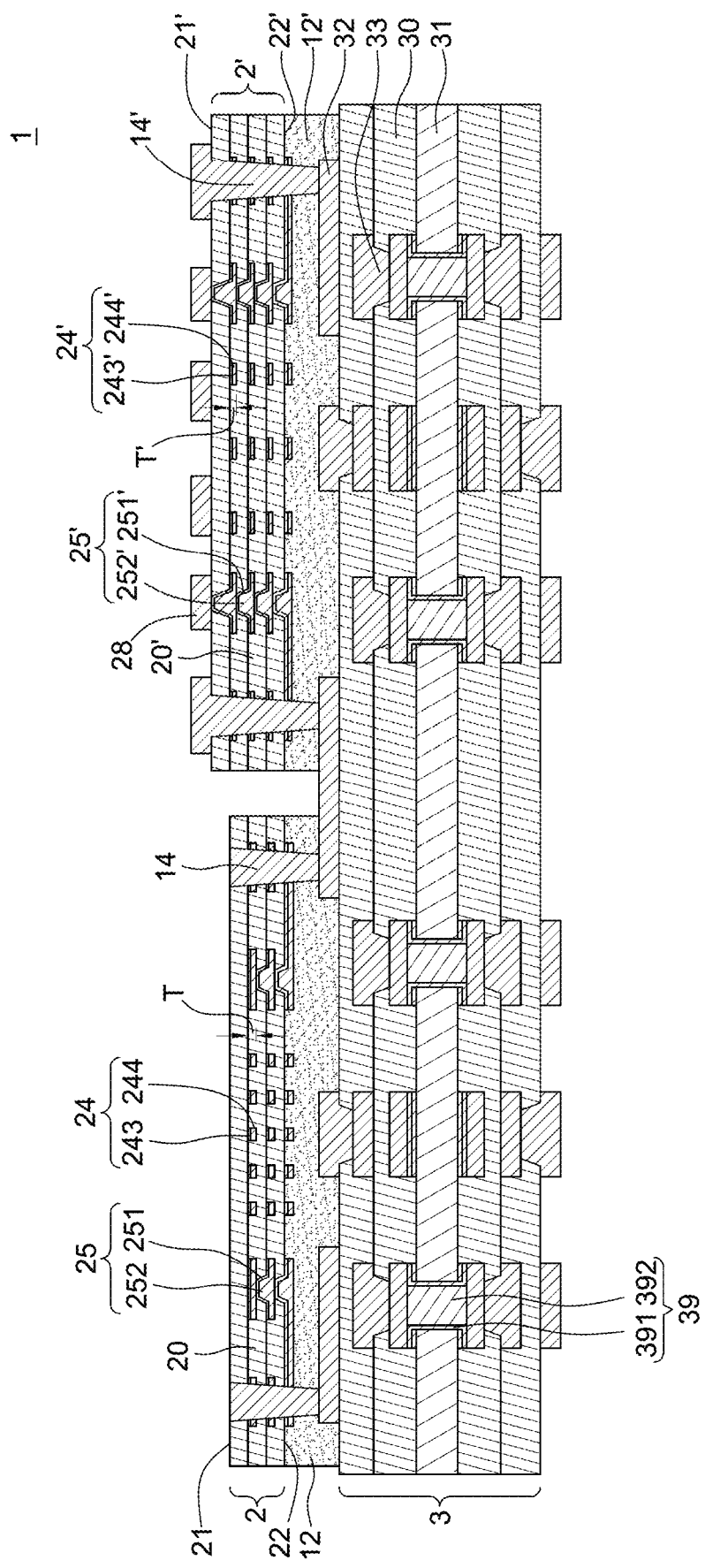
FIG. 2 illustrates a cross-sectional view of a wiring structure according to some embodiments of the present disclosure.

FIG. 2 is a cross-sectional view of a wiring structure 1 in accordance with some embodiments of the present disclosure. The wiring structure 1 includes a first fan-out structure 2, a second fan-out structure 2', and a conductive structure 3. The first fan-out structure 2 and the second fan-out structure 2' are disposed side by side.

The first fan-out structure 2 is disposed on and attached to the conductive structure 3 through a first intermediate layer (or a first bonding layer) 12. The first intermediate layer 12 is interposed or disposed between the first fan-out structure 2 and the conductive structure 3 to bond the first fan-out structure 2 and the conductive structure 3 together. That is, the first intermediate layer 12 adheres to a bottom surface 22 of the first fan-out structure 2 and the top surface of the conductive structure 3. In some embodiments, the first intermediate layer 12 may be an adhesion layer that is cured from an adhesive material (e.g., includes a cured adhesive material such as an adhesive polymeric material).

The second fan-out structure 2' is disposed on and attached to the conductive structure 3 through a second intermediate layer (or a second bonding layer) 12'. The second intermediate layer 12' is interposed or disposed between the second fan-out structure 2' and the conductive structure 3 to bond the second fan-out structure 2' and the conductive structure 3 together. That is, the second intermediate layer 12' adheres to a bottom surface 22' of the second fan-out structure 2' and the top surface of the conductive structure 3. In some embodiments, the second intermediate layer 12' may be an adhesion layer that is cured from an adhesive material (e.g., includes a cured adhesive material such as an adhesive polymeric material). In some embodiments, the first fan-out structure 2 is separated from the second fan-out structure 2', and the first intermediate layer 12 is separated from the second intermediate layer 12'.

In some embodiments, materials of the intermediate layers 12, 12' are transparent, and can be seen through by human eyes or machine. That is, a mark disposed adjacent to the top surface of the conductive structure 3 can be recognized or detected from an upper surface (or a top surface) 21 of the first fan-out structure 2 and a top surface of the second fan-out structure 2' by human eyes or machine. In some embodiments, the intermediate layers 12, 12' is substantially free of reinforcement material such as glass fiber. That is, the intermediate layers 12, 12' may be devoid of reinforcement material such as glass fiber, and may include a homogeneous material composition of a resin. Alternatively, the intermediate layers 12, 12' may include a small amount of reinforcement material such as glass fiber, for example, about 5% by weight or less, about 3% by weight or less, or about 2% by weight or less. In addition, materials of the intermediate layers 12, 12' may include an insulating film, such as Ajinomoto build-up film (ABF). Material or function of the first intermediate layer 12 may be the same as or different from those of the second intermediate layer 12'.

The conductive structure 3 includes at least one dielectric layer 30 and at least one circuit layer 32 in contact with the dielectric layer 30. The at least one circuit layer 32 may be disposed on or embedded in the dielectric layer 30. The circuit layer 32 may be a patterned conductive layer. An L/S of the circuit layer 32 may be greater than or equal to about 10 μm/about 10 μm. In some embodiments, the conductive structure 3 may be similar to a core substrate that further includes a core portion 31, and may be in a wafer type, a panel type or a strip type. The conductive structure 3 may be also referred to as "a stacked structure" or "a low-density conductive structure" or "a low-density stacked structure". The circuit layer 32 of the conductive structure 3 may be also referred to as "a low-density circuit layer". The conductive structure 3 includes a plurality of dielectric layers 30, a plurality of circuit layers 32, and at least one inner via 33 vertically connected to the circuit layers 32.

The core portion 31 defines a plurality of through holes extending through the core portion 31. An interconnection via 39 is disposed or formed in each through hole for vertical connection. In some embodiments, each interconnection via 39 includes a base metallic layer 391 and an insulation material 392. The base metallic layer 391 is disposed or formed on a side wall of the through hole, and defines a central through hole. The insulation material 392 fills the central through hole defined by the base metallic layer 391. In some embodiments, the interconnection via 39 may omit an insulation material, and may include a bulk metallic material that fills the through hole. The interconnection via 39 is in contact with the circuit layers 32.

In some embodiments, at least one dielectric layer 30 of the conductive structure 3 is substantially free of reinforcement material such as glass fiber. That is, the dielectric layer 30 of the conductive structure 3 may be devoid of reinforcement material such as glass fiber, and may include a homogeneous material composition of a resin. Alternatively, the dielectric layer 30 of the conductive structure 3 may include a small amount of reinforcement material such as glass fiber, for example, about 5% by weight or less, about 3% by weight or less, or about 2% by weight or less. In addition, a material of the dielectric layer 30 of the conductive structure 3 may include an insulating film, such as ABF.

The first fan-out structure 2 includes the upper surface 21 and a lower surface (or a bottom surface) 22 opposite to the upper surface 21. The first fan-out structure 2 includes at least one dielectric layer 20 and at least one first circuit layer 24 in contact with the dielectric layer 20. The first fan-out structure 2 includes at least one first through via 14. The first fan-out structure 2 includes a plurality of dielectric layers 20, a plurality of first circuit layers 24, and a plurality of inner via 25. In some embodiments, the first fan-out structure 2 may be similar to a coreless substrate, and may be in a wafer type, a panel type or a strip type. The first fan-out structure 2 may be also referred to as "a stacked structure" or "a high-density conductive structure" or "a high-density stacked structure". The first circuit layer 24 of the first fan-out structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, a trace or a pad) in a unit area of the high-density circuit layer is greater than the count of the circuit line in an equal unit area of the low-density circuit layer, such as about 1.2 times or greater, about 1.5 times or greater, or about 2 times or greater. Alternatively, or in combination, a line width/line space (L/S) of the high-density circuit layer is less than a L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure". A thickness of the first fan-out structure 2 is less than a thickness of the second fan-out structure 2' since a count of dielectric layer and/or circuit layer of the first fan-out structure 2 may be less than a count of dielectric layer and/or circuit layer of the second fan-out structure 2'.

The first circuit layers 24 may be fan-out circuit layers or redistribution layers (RDLs). An L/S of the first circuit layers 24 may be less than or equal to about 2 μm/about 2 or less than or equal to about 1.8 μm/about 1.8 μm. Thus, the L/S of the circuit layer 32 of the conductive structure 3 may be greater than or equal to about three times, four times, or five times the L/S of the first circuit layers 24 of the first fan-out structure 2.

Each of the first circuit layers 24 may include a seed layer 243 and a conductive metallic material 244 disposed on the seed layer 243. Each of the first circuit layers 24 has a thickness T. The first circuit layers 24 have a high density in the dielectric layer 20. The first circuit layers 24 have a high area density (e.g. a percentage of an area of a surface occupied by the first circuit layers 24 from a top view) in the dielectric layer 20. The first circuit layer 24 may be a SerDes circuit. The first circuit layer 24 may have a fine L/S. A SerDes signal is transmitted in the first fan-out structure 2. The SerDes signal is transmitted in the circuit layers 24 of the first fan-out structure 2.

The inner vias 25 are disposed between two adjacent first circuit layers 24 for electrically connecting the two first circuit layers 24. Each of the inner vias 25 may include a seed layer 251 and a conductive metallic material 252 disposed on the seed layer 251. Each of the inner vias 25 tapers upwardly along a direction from the lower surface 22 towards the upper surface 21 of the first fan-out structure 2.

The first through via 14 extends through at least a portion of the first fan-out structure 2 and the first intermediate layer 12, and is electrically connected to the topmost circuit layer 32 of the conductive structure 3. The first through via 14 penetrates the first circuit layer 24 and is electrically in contact with the circuit layer 32 of the conductive structure 3. The first through via 14 extends from the upper surface 21 of the first fan-out structure 2 into the first intermediate layer 12. The first through via 14 extends through and contacts the first circuit layers 24, and terminates at or on, and contacts a portion of the topmost circuit layer 32 of the conductive structure 3. An upper surface of the first through via 14 is substantially coplanar with the upper surface 21 of the first fan-out structure 2. As shown in FIG. 2, the first through via 14 tapers downwardly along a direction from the upper surface 21 towards the lower surface 22 of the first fan-out structure 2. Thus, a tpering direction of the first through via 14 is different from a tapering direction of the inner via 25.

The first fan-out structure 2 and the second fan-out structure 2' electrically communicate with each other through the circuit layer 32 of the conductive structure 3. The first fan-out structure 2 and the second fan-out structure 2' electrically communicate with each other through the topmost circuit layer 32 of the conductive structure 3.

The second fan-out structure 2' includes an upper surface (or a top surface) 21' and a lower surface (or a bottom surface) 22' opposite to the upper surface 21'. The second fan-out structure 2' includes at least one dielectric layer 20' and at least one second circuit layer 24' in contact with the dielectric layer 20'. The second fan-out structure 2' includes at least one second through via 14' and an upper/topmost circuit layer 28. The second fan-out structure 2' includes a plurality of dielectric layers 20', a plurality of second circuit layers 24', and a plurality of inner via 25'. In some embodiments, the second fan-out structure 2' may be similar to a coreless substrate, and may be in a wafer type, a panel type or a strip type. The second fan-out structure 2' may be also referred to as "a stacked structure" or "a high-density conductive structure" or "a high-density stacked structure". The second circuit layer 24' of the second fan-out structure 2' may be also referred to as "a high-density circuit layer".

The second circuit layers 24' may be fan-out circuit layers or RDLs. An L/S of the second circuit layers 24' may be less than or equal to about 2 μm/about 2 μm, or less than or equal to about 1.8 μm/about 1.8 μm. Thus, the L/S of the circuit layer 32 of the conductive structure 3 may be greater than or equal to about three times, four times, or five times the L/S of the second circuit layers 24' of the second fan-out structure 2'. In some embodiments, the L/S of the first circuit layers 24 of the first fan-out structure 2 is less than the L/S of the second circuit layers 24' of the second fan-out structure 2'. Thus, a line width of the first circuit layers 24 of the first fan-out structure 2 is less than a line width of the second circuit layers 24' of the second fan-out structure 2'.

Each of the second circuit layers 24' may include a seed layer 243' and a conductive metallic material 244' disposed on the seed layer 243'. Each of the second circuit layers 24' has a thickness T'. The thickness T' of the second circuit layer 24' may be different from the thickness T of the first circuit layers 24. For example, the thickness T of the first circuit layers 24 is greater than the thickness T' of the second circuit layer 24'. In some embodiments, the thickness T of the first circuit layers 24 may be about 10 μm, and the thickness T' of the second circuit layer 24' may be about 3 μm. The second circuit layers 24' have a low density in the dielectric layer 20'. The second circuit layers 24' have a low area density (e.g. a percentage of an area of a surface occupied by the second circuit layers 24' from a top view) in the dielectric layer 20'. The density of the first circuit layer 24 is greater than the density of the second circuit layer 24'. The area density of the first circuit layer 24 is greater than the area density of the second circuit layer 24'. The second circuit layer 24' may have an L/S greater than the L/S of the first circuit layer 24.

In some embodiments, a signal transmitted in the first fan-out structure 2 is different from a signal transmitted in the second fan-out structure 2'. For example, a power signal or a ground signal is transmitted in the second fan-out structure 2'. The power signal or the ground signal is transmitted in the second circuit layers 24' of the second fan-out structure 2'.

The inner vias 25' are disposed between two adjacent second circuit layers 24' for electrically connecting the two second circuit layers 24'. Each of the inner vias 25' may include a seed layer 251' and a conductive metallic material 252' disposed on the seed layer 251'. Each of the inner vias 25' tapers upwardly along a direction from the lower surface 22' towards the upper surface 21' of the second fan-out structure 2'.

The second through via 14' extends through at least a portion of the second fan-out structure 2' and the second intermediate layer 12', and is electrically connected to the topmost circuit layer 32 of the conductive structure 3. The second through via 14' penetrates the second circuit layer 24' and is electrically in contact with the circuit layer 32 of the conductive structure 3. The second through via 14' extends from the upper surface 21' of the second fan-out structure 2' into the second intermediate layer 12'. The second through via 14' extends through and contacts the second circuit layers 24', and terminates at or on, and contacts a portion of the topmost circuit layer 32 of the conductive structure 3. As shown in FIG. 2, the second through via 14' tapers downwardly along a direction from the upper surface 21' towards the lower surface 22' of the second fan-out structure 2'. Thus, a tapering direction of the second through via 14' is different from a tapering direction of the inner via 25'.

The upper circuit layer 28 is disposed on the upper surface 21' of the second fan-out structure 2'. The upper circuit layer 28 and the second through via 14' may be formed concurrently and integrally. The upper circuit layer 28 defines a semiconductor device mounting area for a semiconductor device to be mounted. That is, a semiconductor device may be mounted to the second fan-out structure 2' and in contact with the upper circuit layer 28 of the second fan-out structure 2'.

On the basis of such arrangement, the first fan-out structure 2 and the second fan-out structure 2' are designed for transmitting SerDes signals and power/ground signals, respectively. The first fan-out structure 2 and the second fan-out structure 2' have different signal paths. The first fan-out structure 2 may be used for transmitting the SerDes signal which was traditionally transmitted in a conventional conductive structure due to its high frequency. Also, since the circuit layer 24 of the first fan-out structure 2 has relatively small L/S, high density, and high thickness, the first fan-out structure 2 may be dedicated for SerDes signal transmission.

During a manufacturing process, the conductive structure 3, the first fan-out structure 2, and the second fan-out structure 2' may be tested individually before being bonded together. Therefore, known good conductive structure 3 and known good fan-out structures 2, 2' may be selectively bonded together. Bad (or unqualified) conductive structure 3 and bad (or unqualified) fan-out structures 2, 2' may be discarded. As a result, the yield of the wiring structure 1 may be improved. Further, the costs of the first fan-out structure 2 and the second fan-out structure 2' themselves are very high. Since unqualified element(s) (e.g., anyone of the conductive structure 3, the first fan-out structure 2, and the second fan-out structure 2') may be found beforehand, the costs for manufacturing the wiring structure 1 could be dramatically saved.

Figure 2A:
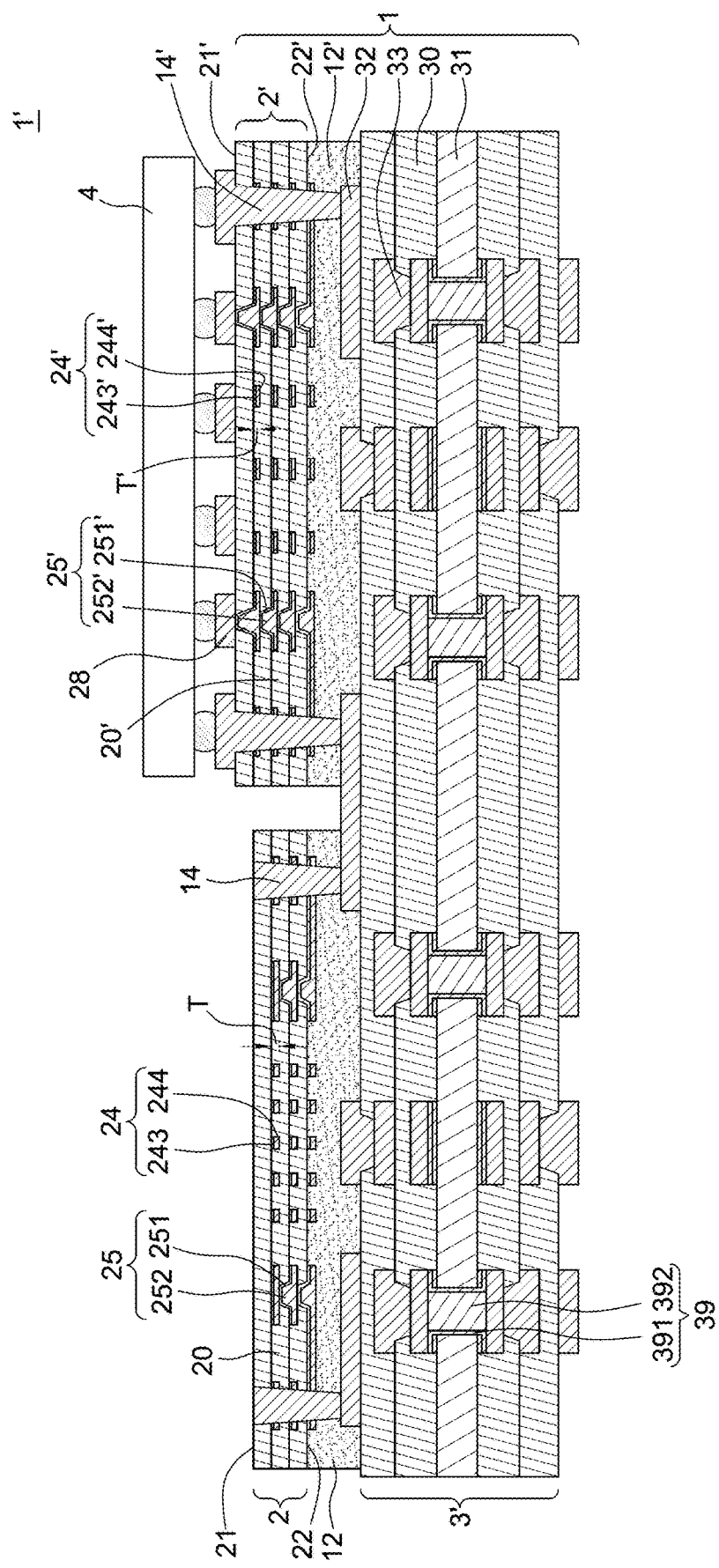
FIG. 2A illustrates a cross-sectional view of an assembly structure according to some embodiments of the present disclosure.

FIG. 2A is a cross-sectional view of an assembly structure 1' in accordance with some embodiments of the present disclosure. The assembly structure 1' includes a wiring structure 1 and a semiconductor device 4. The wiring structure 1 of FIG. 2A is similar to the wiring structure 1 in FIG. 2. The semiconductor device 4 is attached to and electrically connected to the second fan-out structure 2'. The semiconductor device 4 includes an active surface facing the second fan-out structure 2'. The semiconductor device 4 may include a bonding pad (not illustrated) and a solder ball electrically connected to the upper circuit layer 28 of the second fan-out structure 2'. The second fan-out structure 2' may transmit power signal/ground signal from the semiconductor device 4 to the conductive structure 3. In addition, the first fan-out structure 2 may not be used for external connection. Thus, there may be no device attached to the upper surface 21 of the first fan-out structure 2. The high frequency signals (e.g., SerDes signals) from the semiconductor device 4 may be transmitted to the second fan-out structure 2' through the second fan-out structure 2' and the conductive structure 3. The first fan-out structure 2 may not transmit power/ground signals FIG. 3A through FIG. 3E illustrate some embodiments of a method of manufacturing a wiring structure 1 according to some embodiments of the present disclosure. Various figures have been simplified to more clearly present aspects of the present disclosure.

Figure 3A:
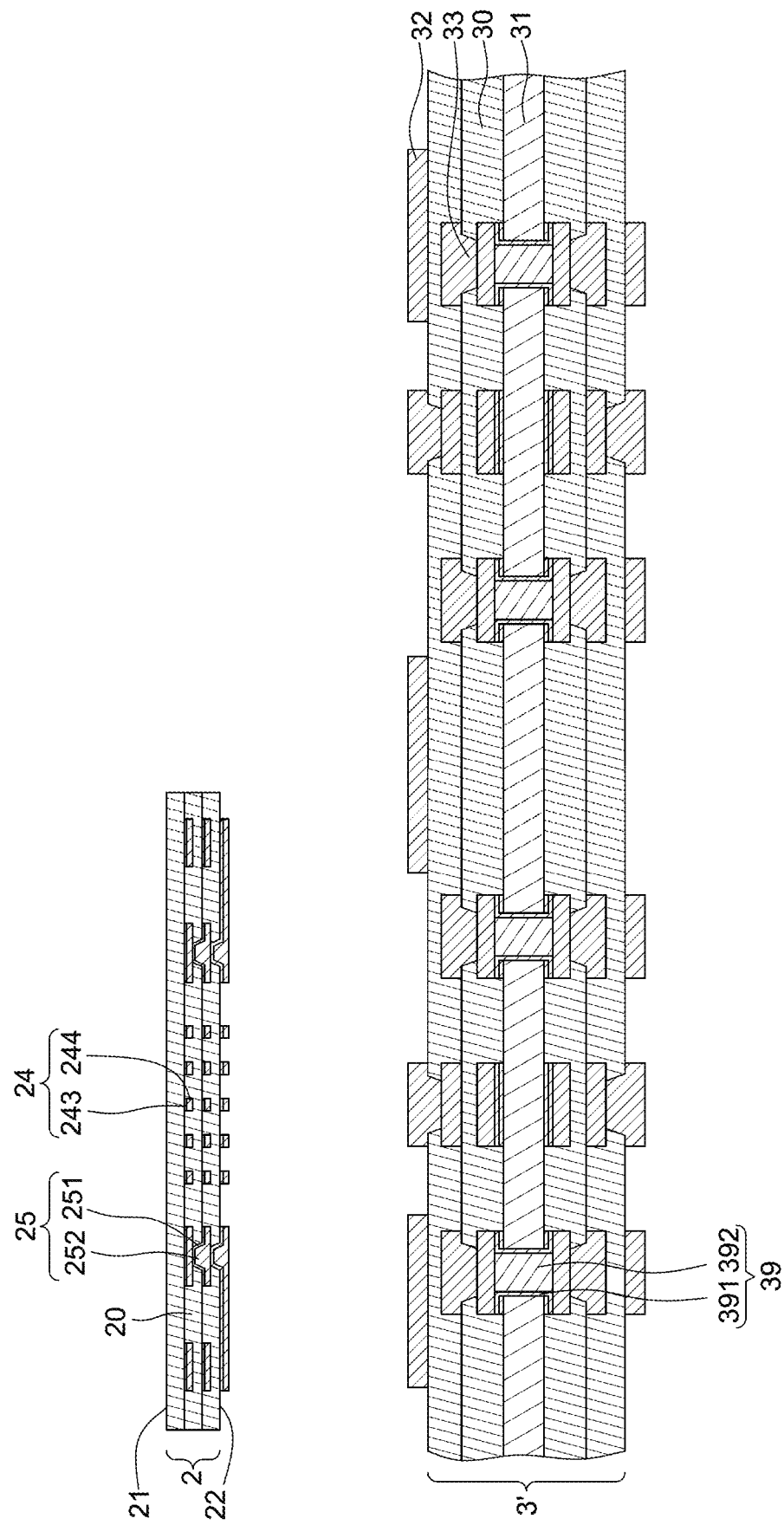
FIG. 3A illustrates one or more stages of an example of a method for manufacturing a wiring structure according to some embodiments of the present disclosure.

Referring to FIG. 3A, a conductive structure 3' is provided. The conductive structure 3' includes at least one dielectric layer 30, at least one circuit layer 32 disposed on the at least one dielectric layer 30, and at least one inner via 33. The conductive structure 3' further includes a core portion 31 and an interconnection via 39. The interconnection via 39 includes a base metallic layer 391 and an insulation material 392. The conductive structure 3' of FIG. 3A is similar to the conductive structure 3 in FIG. 2.

Also, a first fan-out structure 2 is provided. The first fan-out structure 2 is manufactured by a first operation. The first fan-out structure 2 of FIG. 3A is similar to the first fan-out structure 2 in FIG. 2. The first fan-out structure 2 has an upper surface 21 and a lower surface 22 opposite to the upper surface 21. The first fan-out structure 2 includes at least one dielectric layer 20 and at least one first circuit layer 24 in contact with the dielectric layer 20. In some embodiments, the first fan-out structure 2 includes a plurality of dielectric layers 20, a plurality of second circuit layers 24, and at least one inner via 25.

The first circuit layer 24 may include a seed layer 243 and a conductive metallic material 244 disposed on the seed layer 243. The seed layer 243 may include Ti, TiCu or other suitable materials. The conductive metallic material 244 may include Cu, Au, or other suitable materials.

The inner via 25 may include a seed layer 251 and a conductive metallic material 252 disposed on the seed layer 251. The seed layer 251 may include Ti, TiCu or other suitable materials. The conductive metallic material 252 may include Cu, Au, or other suitable materials.

Figure 3B:
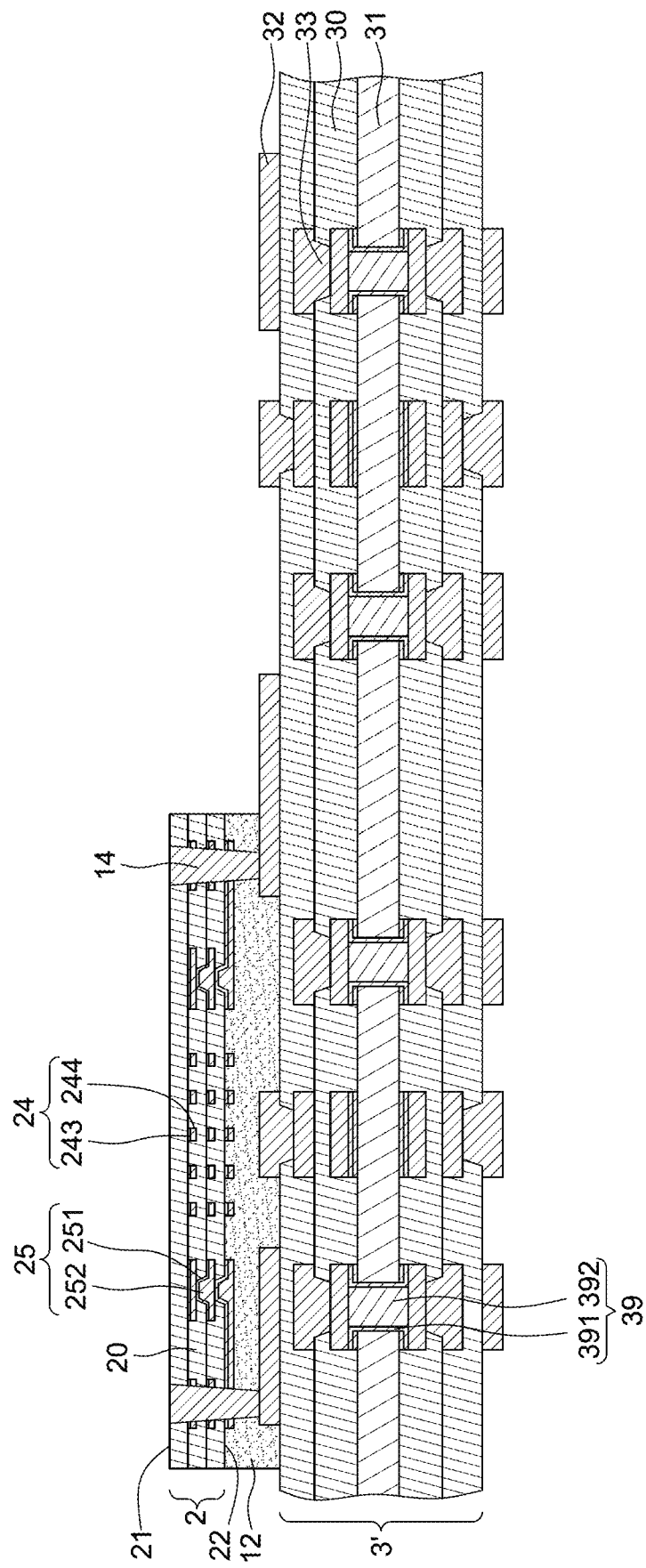
FIG. 3B illustrates one or more stages of an example of a method for manufacturing a wiring structure according to some embodiments of the present disclosure.

Referring to FIG. 3B, the first fan-out structure 2 is disposed on or mounted to the conductive structure 3' through a first intermediate layer 12. The first intermediate layer 12 may be an adhesive layer. Then, at least one first through via 14 is formed. The first through via 14 penetrates the first circuit layer 24 located at the periphery of the first fan-out structure 2. The first through via 14 extends through at least a portion of the first fan-out structure 2 and the first intermediate layer 12, and is electrically connected to and contacts the topmost circuit layer 32 of the conductive structure 3'.

Figure 3C:
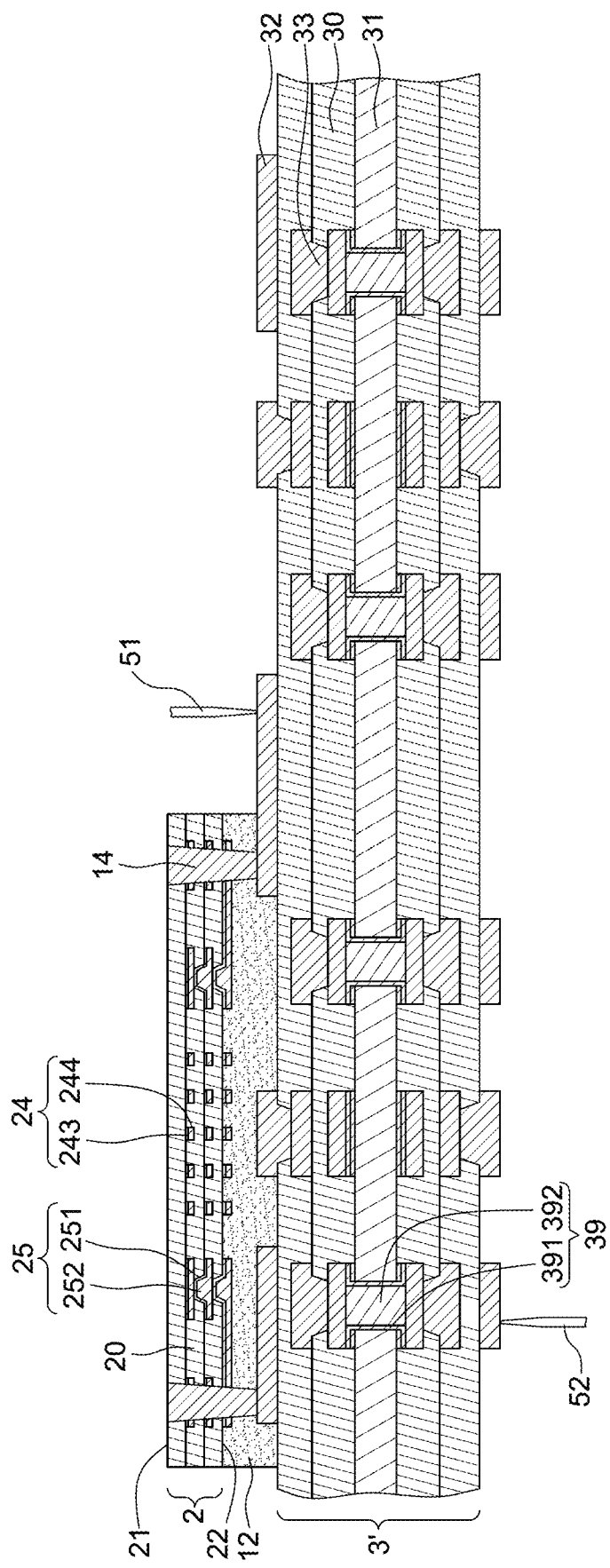
FIG. 3C illustrates one or more stages of an example of a method for manufacturing a wiring structure according to some embodiments of the present disclosure.

Referring to FIG. 3C, a testing operation is performed. One probe 51 is disposed on and in contact with the topmost circuit layer 32 of the conductive structure 3' that the first through via 14 is disposed on. Another probe 52 is disposed on and in contact with a bottommost circuit layer 32 so as to test the circuits between the first fan-out structure 2 and the conductive structure 3' and confirm whether the first fan-out structure 2 is a qualified one. The cost of the first fan-out structure 2 is more expensive than that of the second fan-out structure 2'. Accordingly, the first fan-out structure 2 is provided on the conductive structure 3' before the second fan-out structure 2' such that the first fan-out structure 2 would be tested preferentially. If the first fan-out structure 2 is an unqualified one, it would be handy to replace the unqualified one with a new one. In addition, the cost of the semiconductor device 4 is more expensive than that of the first fan-out structure 2. Thus, if the first fan-out structure 2 is an unqualified one, the second fan-out structure 2' and the semiconductor device 4 may not be attached to the conductive structure 3'.

Figure 3D:
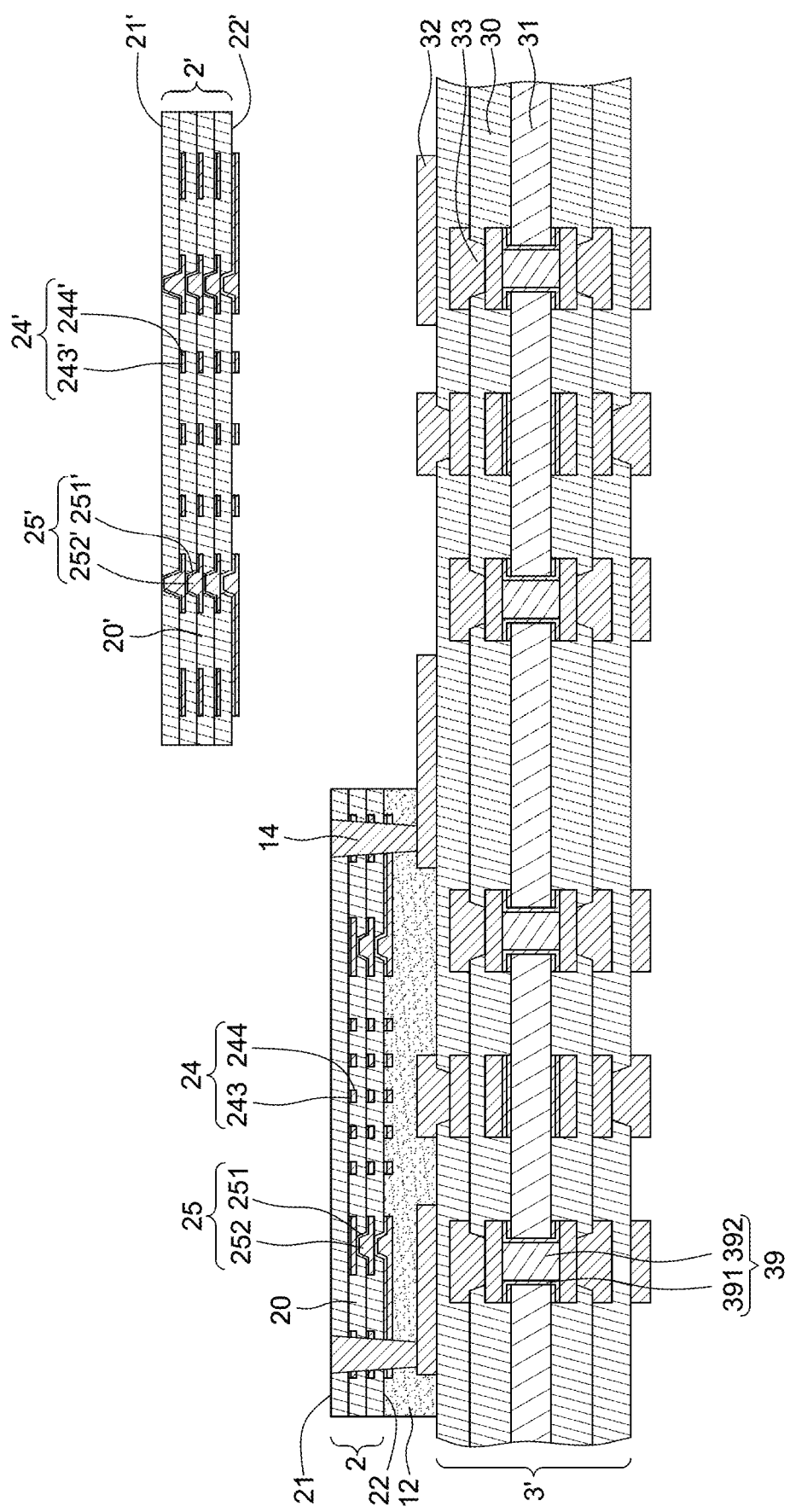
FIG. 3D illustrates one or more stages of an example of a method for manufacturing a wiring structure according to some embodiments of the present disclosure.

Referring to FIG. 3D, a second fan-out structure 2' is provided. The second fan-out structure 2' is manufactured by a second operation which is different from the first operation. That is, the first fan-out structure 2 and the second fan-out structure 2' are manufactured separately. The second fan-out structure 2' includes an upper surface 21' and a lower surface 22' opposite to the upper surface 21'. The second fan-out structure 2' includes at least one dielectric layer 20' and at least one second circuit layer 24' in contact with the dielectric layer 20'. The second fan-out structure 2' includes at least one second through via 14'. The second fan-out structure 2' includes a plurality of dielectric layers 20', a plurality of second circuit layers 24', and at least one inner via 25'.

The second circuit layer 24' may include a seed layer 243' and a conductive metallic material 244' disposed on the seed layer 243'. The seed layer 243' may include Ti, TiCu or other suitable materials. The conductive metallic material 244' may include Cu, Au, or other suitable materials.

The inner via 25' may include a seed layer 251' and a conductive metallic material 252' disposed on the seed layer 251'. The seed layer 251' may include Ti, TiCu or other suitable materials. The conductive metallic material 252' may include Cu, Au, or other suitable materials.

Figure 3E:
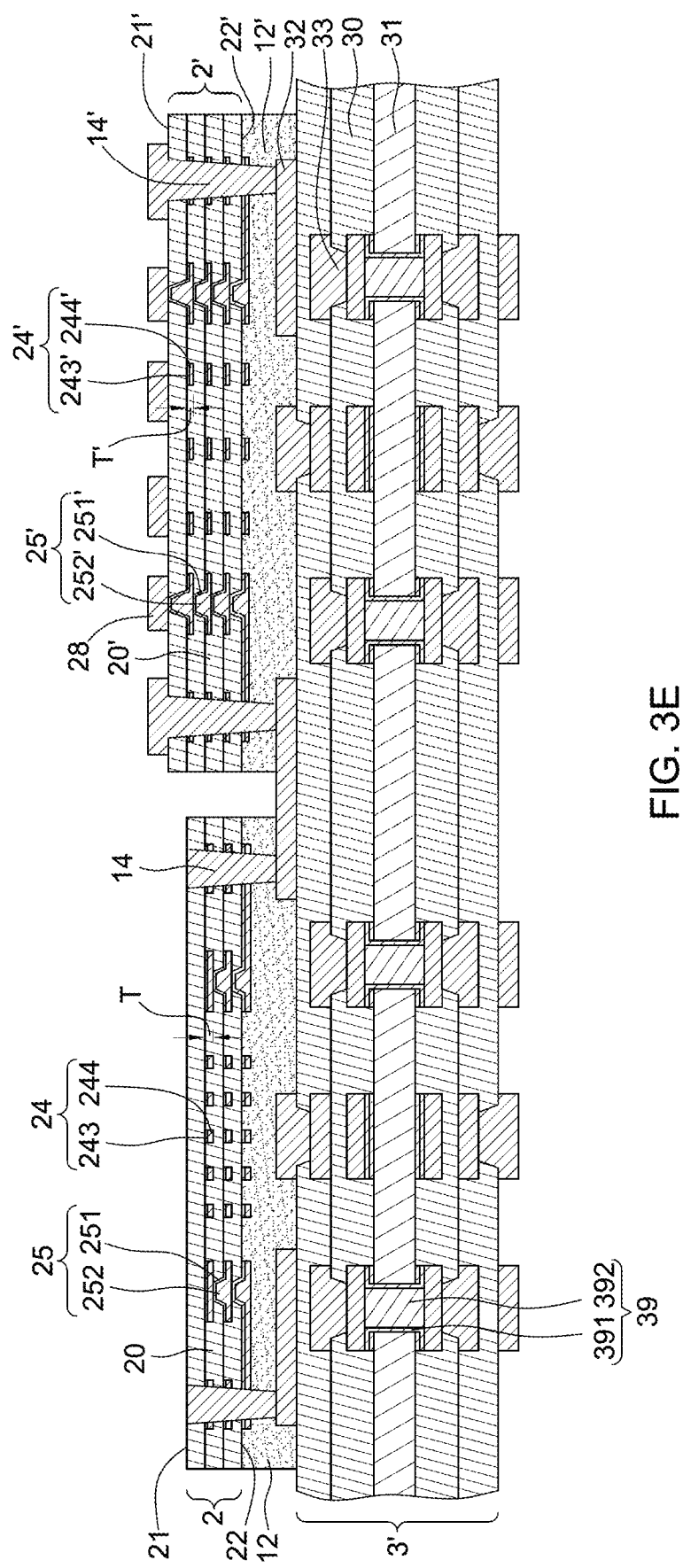
FIG. 3E illustrates one or more stages of an example of a method for manufacturing a wiring structure according to some embodiments of the present disclosure.

Referring to FIG. 3E, the second fan-out structure 2' is disposed on or mounted to the conductive structure 3' through a second intermediate layer 12'. Thus, the second fan-out structure 2' is adjacent to the first fan-out structure. Then, at least one second through via 14' and an upper/topmost circuit layer 28 are formed. The second through via 14' penetrates the second fan-out structure 2' and the second intermediate layer 12', and is electrically connected to and contacts the topmost circuit layer 32 of the conductive structure 3'. The upper circuit layer 28 is disposed on the upper surface 21' of the second fan-out structure 2'. The upper circuit layer 28 and the second through via 14' may be formed concurrently and integrally. The second circuit layers 24', the upper circuit layer 28 and the second through via 14' may include Cu, Au, or other suitable materials.

Then, the conductive structure 3' is singulated so as to form the wiring structure 1 of FIG. 2.

In some embodiments, the conductive structure 3', the first fan-out structure 2, and the second fan-out structure 2' may be tested individually before being bonded together. The assembly of the first fan-out structure 2, the second fan-out structure 2', and the conductive structure 3 is tested so as to test the circuits between the first fan-out structure 2, the second fan-out structure 2', and the conductive structure 3.

As used herein, spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A wiring structure, comprising:
a conductive structure;
a first fan-out structure disposed on the conductive structure, and including a first circuit layer; and
a second fan-out structure disposed on the conductive structure, and including a second circuit layer,
wherein a thickness of the first circuit layer is different from a thickness of the second circuit layer, and
wherein the first circuit layer of the first fan-out structure is a SerDes (Serializer/Deserializer) circuit.

2. A wiring structure, comprising:
a conductive structure;
a first fan-out structure disposed on the conductive structure, and including a first circuit layer;
a second fan-out structure disposed on the conductive structure, and including a second circuit layer;
a first intermediate layer bonding the first fan-out structure and the conductive structure; and
a second intermediate layer bonding the second fan-out structure and the conductive structure,
wherein a thickness of the first circuit layer is different from a thickness of the second circuit layer,
wherein the first fan-out structure includes a first through via extending from an upper surface of the first fan-out structure into the first intermediate layer,
wherein the first through via penetrates the first circuit layer and is electrically in contact with a circuit layer of the conductive structure, and
wherein the first fan-out structure and the second fan-out structure electrically communicate with each other through the circuit layer of the conductive structure.

3. A wiring structure, comprising:
a conductive structure;
a first fan-out structure disposed on the conductive structure, and including a first circuit layer; and
a second fan-out structure disposed on the conductive structure, and including a second circuit layer,
wherein a thickness of the first circuit layer is different from a thickness of the second circuit layer,
wherein the second fan-out structure includes an upper circuit layer disposed on an upper surface of the second fan-out structure, and wherein the upper circuit layer defines a semiconductor device mounting area.

4. The wiring structure of claim 3, wherein the thickness of the first circuit layer is greater than the thickness of the second circuit layer.

5. The wiring structure of claim 3, wherein a thickness of the first fan-out structure is less than a thickness of the second fan-out structure.

6. The wiring structure of claim 3, wherein a density of the first circuit layer is greater than a density of the second circuit layer.

7. The wiring structure of claim 3, further comprising a first intermediate layer bonding the first fan-out structure and the conductive structure, and a second intermediate layer bonding the second fan-out structure and the conductive structure.

8. The wiring structure of claim 7, wherein the first fan-out structure includes a first through via extending from an upper surface of the first fan-out structure into the first intermediate layer.

9. The wiring structure of claim 8, wherein the first through via penetrates the first circuit layer and is electrically in contact with a circuit layer of the conductive structure.

10. The wiring structure of claim 3, wherein a line width/line space (L/S) of the first circuit layer of the first fan-out structure is less than a L/S of the second circuit layer of the second fan-out structure.

11. A wiring structure, comprising:
a conductive structure;
a first fan-out structure disposed on the conductive structure; and
a second fan-out structure disposed on the conductive structure,
wherein a signal transmitted in the first fan-out structure is different from a signal transmitted in the second fan-out structure,
wherein the signal transmitted in the first fan-out structure is a high frequency signal, and the signal transmitted in the second fan-out structure is a power signal or a ground signal.

12. The wiring structure of claim 11, wherein the first fan-out structure includes a first circuit layer, and the second fan-out structure includes a second circuit layer.

13. The wiring structure of claim 11, further comprising a first intermediate layer interposed between the first fan-out structure and the conductive structure, and a second intermediate layer interposed between the second fan-out structure and the conductive structure.

14. A wiring structure, comprising:
a conductive structure;
a first fan-out structure disposed on the conductive structure; and
a second fan-out structure disposed on the conductive structure,
wherein a signal transmitted in the first fan-out structure is different from a signal transmitted in the second fan-out structure, and
wherein the conductive structure includes at least one dielectric layer and a circuit layer disposed on the at least one dielectric layer, and wherein the first fan-out structure is electrically connected to the second fan-out structure through the circuit layer of the conductive structure.

15. The wiring structure of claim 11, wherein the first fan-out structure and the second fan-out structure are disposed side by side.

* * * * *